United States Patent
Dunn

(10) Patent No.: US 11,096,317 B2
(45) Date of Patent: Aug. 17, 2021

(54) DISPLAY ASSEMBLY WITH LOOPBACK COOLING

(71) Applicant: Manufacturing Resources International, Inc., Alpharetta, GA (US)

(72) Inventor: William Dunn, Alpharetta, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 0 days.

(21) Appl. No.: 16/798,909

(22) Filed: Feb. 24, 2020

(65) Prior Publication Data
US 2020/0275585 A1 Aug. 27, 2020

Related U.S. Application Data

(60) Provisional application No. 62/810,839, filed on Feb. 26, 2019.

(51) Int. Cl.
*H05K 7/20* (2006.01)
*G02F 1/1333* (2006.01)

(52) U.S. Cl.
CPC ... *H05K 7/20972* (2013.01); *G02F 1/133385* (2013.01)

(58) Field of Classification Search
CPC ... G02B 5/30; G02B 6/0055; G02F 1/133528; G02F 2001/133388; G02F 1/133308;
(Continued)

(56) References Cited

U.S. PATENT DOCUMENTS 4,093,355 A 6/1978 Kaplit et al.
4,593,978 A 6/1986 Mourey et al.
(Continued)

FOREIGN PATENT DOCUMENTS

AU 2011248190 B2 5/2011
AU 2014287438 B2 1/2018
(Continued)

OTHER PUBLICATIONS

Mentley, David E., State of Flat-Panel Display Technology and Future Trends, Proceedings of the IEEE, Apr. 2002, vol. 90, No. 4, pp. 453-459.
(Continued)

*Primary Examiner* — Stephen S Sul
*Assistant Examiner* — Michael A Matey
(74) *Attorney, Agent, or Firm* — Standley Law Group LLP; Jeffrey S. Standley; Adam J. Smith

(57) ABSTRACT

Systems and method for thermally managing display assemblies are provided. A closed loop pathway for circulating gas includes a channel located behind an electronic display located at a housing. A fan unit is positioned within the rear channel. A storage area for an equipment storage device is located within or adjacent to the channel and is partitioned by a barrier. A loopback channel accepts a flow of the circulating gas and forms a pathway about the equipment storage device. The fan unit generates an area of relatively high pressure circulating gas compared to circulating gas in the storage area, which causes a portion of the circulating gas to travel through the loopback channel to cool equipment stored at the equipment storage device.

20 Claims, 2 Drawing Sheets

(58) Field of Classification Search
CPC ........... G02F 1/133385; G07F 17/3211; G09F 13/0413; G09F 13/12; H05K 7/20972
See application file for complete search history.

(56) References Cited

U.S. PATENT DOCUMENTS

| | | | |
|---|---|---|---|
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,088,806 A | 2/1992 | McCartney et al. |
| 5,132,666 A | 7/1992 | Fahs |
| 5,247,374 A | 9/1993 | Terada |
| 5,282,114 A | 1/1994 | Stone |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A * | 5/1998 | Harris ............... G02F 1/133385 349/58 |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A * | 2/1999 | Sato ..................... H01J 29/006 313/17 |
| 5,903,433 A | 5/1999 | Gudmundsson |
| 5,991,153 A * | 11/1999 | Heady ................ H05K 7/20972 361/704 |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,359,390 B1 | 3/2002 | Nagai |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 * | 12/2002 | Gromatzky ....... G02F 1/133385 379/161 |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,480,140 B2 | 1/2009 | Hara et al. |
| 7,518,864 B2 | 4/2009 | Kimura |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |

(56) References Cited

U.S. PATENT DOCUMENTS

| | | |
|---|---|---|
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,861,007 B2 | 1/2018 | Yoon et al. |
| 9,894,800 B2 | 2/2018 | Dunn |
| 10,080,316 B2 | 9/2018 | Dunn et al. |
| 10,088,702 B2 | 10/2018 | Dunn et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 2001/0001459 A1 | 5/2001 | Savant et al. |
| 2001/0019454 A1 | 9/2001 | Tadic-Galeb et al. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |

(56) References Cited

U.S. PATENT DOCUMENTS

| | | |
|---|---|---|
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0065007 A1 | 3/2009 | Wilkinson et al. |
| 2009/0086430 A1* | 4/2009 | Kang .............. H05K 7/2099 361/695 |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0058326 A1* | 3/2011 | Idems ............... G09F 9/30 361/679.21 |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1* | 4/2011 | Dunn .............. H05K 7/20972 361/695 |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1* | 5/2011 | Sato ............... G02F 1/133385 345/690 |
| 2011/0141672 A1 | 6/2011 | Farley, Jr. et al. |
| 2011/0141724 A1 | 6/2011 | Erion |
| 2011/0162831 A1* | 7/2011 | Lee ............... H05K 7/20972 165/287 |
| 2011/0167845 A1* | 7/2011 | Lee ............... F04D 25/166 62/89 |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0188481 A1* | 7/2012 | Kang ............... G02F 1/133385 349/61 |
| 2012/0206687 A1 | 8/2012 | Dunn et al. |
| 2012/0223877 A1* | 9/2012 | Cho ............... G02F 1/133528 345/102 |
| 2012/0236499 A1* | 9/2012 | Murayama ......... H05K 7/20972 361/696 |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0190240 A1 | 7/2014 | He et al. |
| 2014/0268657 A1 | 9/2014 | Dunn et al. |
| 2014/0313698 A1 | 10/2014 | Dunn et al. |
| 2014/0314395 A1 | 10/2014 | Dunn et al. |
| 2014/0334100 A1* | 11/2014 | Yoon ............... G09F 9/33 361/692 |
| 2014/0361138 A1 | 12/2014 | Ramirez et al. |
| 2015/0009627 A1* | 1/2015 | Dunn ............... H05K 7/20972 361/697 |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0042134 A1 | 2/2018 | Dunn et al. |
| 2018/0088398 A1* | 3/2018 | Lee ............... H05K 7/20972 |
| 2018/0116073 A1 | 4/2018 | Dunn |

(56) References Cited

U.S. PATENT DOCUMENTS

| | | | |
|---|---|---|---|
| 2018/0314103 A1 | 11/2018 | Dunn et al. | |
| 2018/0315356 A1 | 11/2018 | Dunn et al. | |
| 2018/0317330 A1 | 11/2018 | Dunn et al. | |
| 2018/0317350 A1 | 11/2018 | Dunn et al. | |
| 2018/0364519 A1* | 12/2018 | Dunn | G02F 1/133382 |
| 2019/0037738 A1 | 1/2019 | Dunn et al. | |
| 2019/0089176 A1 | 3/2019 | Dunn et al. | |
| 2019/0133002 A1 | 5/2019 | Dunn et al. | |
| 2019/0208674 A1 | 7/2019 | Demars | |
| 2019/0239365 A1 | 8/2019 | Dunn et al. | |
| 2019/0289754 A1 | 9/2019 | Hubbard | |
| 2019/0327865 A1 | 10/2019 | Dunn et al. | |
| 2020/0390009 A1* | 12/2020 | Whitehead | H05K 7/20145 |

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| AU | 2015229457 B2 | 3/2019 |
| AU | 2016220308 B2 | 3/2019 |
| BR | PI0820231-1 | 2/2019 |
| CA | 2705814 C | 2/2018 |
| CA | 2947524 C | 4/2018 |
| CA | 2915261 C | 8/2018 |
| CA | 27982777 C | 6/2019 |
| CA | 2809019 C | 9/2019 |
| CA | 2888494 C | 9/2019 |
| CN | 2702363 Y | 5/2005 |
| CN | 107251671 A | 10/2017 |
| CN | 108700739 A | 10/2018 |
| CN | 107251671 B | 8/2019 |
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | 8115788 A | 5/1996 |
| JP | 8194437 A | 7/1996 |
| JP | H08-305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2000-10501 A | 1/2000 |
| JP | 2001209126 A | 8/2001 |
| JP | 2002-6282 A | 1/2002 |
| JP | 2002158475 A | 5/2002 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2006176112 A | 7/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-503663 A | 1/2011 |
| JP | 2011-75819 A | 4/2011 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| KR | 20000000118 U | 1/2000 |
| KR | 20000047899 A | 7/2000 |
| KR | 10-2067751 B1 | 1/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 10-2006-0070176 A | 6/2006 |
| KR | 100666961 B1 | 1/2007 |
| KR | 1020070070675 A | 4/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| RU | 2513043 C2 | 4/2014 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |

(56) References Cited

FOREIGN PATENT DOCUMENTS

WO     WO2018/200260 A1    11/2018
WO     WO2018/200905 A1    11/2018

OTHER PUBLICATIONS

Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC.* V *Manufacturing Resources International, Inc.,* Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC.* V *Manufacturing Resources International, Inc.,* Defendant's Amended Answer and Countercliams to Plaintiff's First Amended Complaint, Filed Apr. 24, 2018, 240 pages.
Itsenclosures, Product Catalog, 2009, 48 pages.
Itsenclosures, Standard Product Data Sheet, 2011, 18 pages.
SunbriteTV, All Weather Outdoor LCD Television Model 4610HD, 2008, 1 page.
SunbriteTV, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation,Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A-Appendix D, Jan. 24, 2018, 51 pages.
Civiq, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC* V. *Manufacturing Resources International, Inc.,* Memorandum Opinion re claim construction, Sep. 27, 2018, 16 pages.
*Civiq Smartscapes, LLC* V. *Manufacturing Resources International, Inc.,* Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.

\* cited by examiner

DISPLAY ASSEMBLY WITH LOOPBACK COOLING

CROSS-REFERENCE TO RELATED APPLICATIONS

This application claims the benefit of U.S. provisional patent application Ser. No. 62/810,839 filed Feb. 26, 2019, the disclosure of which is hereby incorporated by reference as if fully restated herein.

TECHNICAL FIELD

Exemplary embodiments relate generally to systems and methods for thermally managing display assemblies, and component thereof, by providing loopback cooling.

BACKGROUND AND SUMMARY OF THE INVENTION

Electronic displays are increasingly being used in various out of home applications, such as on sidewalks, bus shelters, walls, and the like to provide information, wayfinding, and communication services, display advertisements, and the like. These electronic displays and their related components and equipment are often subject to extreme temperatures, sunlight, wind, rain, hail, sleet, snow, floods, vandalism, and the like. To help protect the sensitive electronic displays as well as the related sensitive components and equipment, in many cases the electronic display(s) and the related components and equipment are placed within a ruggedized housing. However, the electronic displays and their related components and equipment generally generate heat, which must be removed from the assembly to prevent damage. In many cases, simply allowing ambient air to pass over the exterior of the assembly is insufficient to provide the level of cooling required to keep the assembly functional and operating at optimal levels. Therefore, what is needed is a system and method for thermally managing a display assembly.

Systems and methods for thermally managing display assemblies are provided. Such systems and methods may include loopback cooling, especially for components located at an equipment storage device. Each display assembly may comprise one or more open loop pathways for ambient air and one or more closed loop pathways for circulating gas. The open loop pathway(s) and the closed loop pathway(s) may be configured to provide thermal interaction between the ambient air in the open loop pathway(s) and the circulating gas within the closed loop pathway(s). Such thermal interaction may occur at one or more heat exchangers located within the display assembly. One or more open loop channels may be located behind one or more respective electronic displays. One or more storage areas may be defined by the open loop channel(s), the heat exchanger(s), and one or more barriers. One or more equipment storage devices may be located within each storage area. A fan unit may push or pull circulating gas through front channels, which may be defined between transparent covers and the respective electronic displays, as well as through the heat exchanger(s) such that the one or more closed loop pathways are formed. The area between the heat exchanger(s) and the fan unit may be relatively low pressure compared to the areas between the fan unit and the front channels. This may be due to the pressures created by the fan unit.

A portion of the circulating gas in the closed loop passing through the fan unit may be looped back towards the storage area due to a pressure imbalance. A barrier may extend between the equipment storage devices and the fan unit to separate the loopback flow entering and exiting the storage area. The loopback flow may circulate or enter the equipment storage devices to cool the equipment stored therein before reentering the fan unit and rejoining the circulating gas. In this way, an appropriate amount of the circulating gas which has already been cooled at the heat exchanger may be provided to the equipment in the equipment storage devices. Otherwise, such equipment would likely be exposed only to heated circulating gas exiting the front channels.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
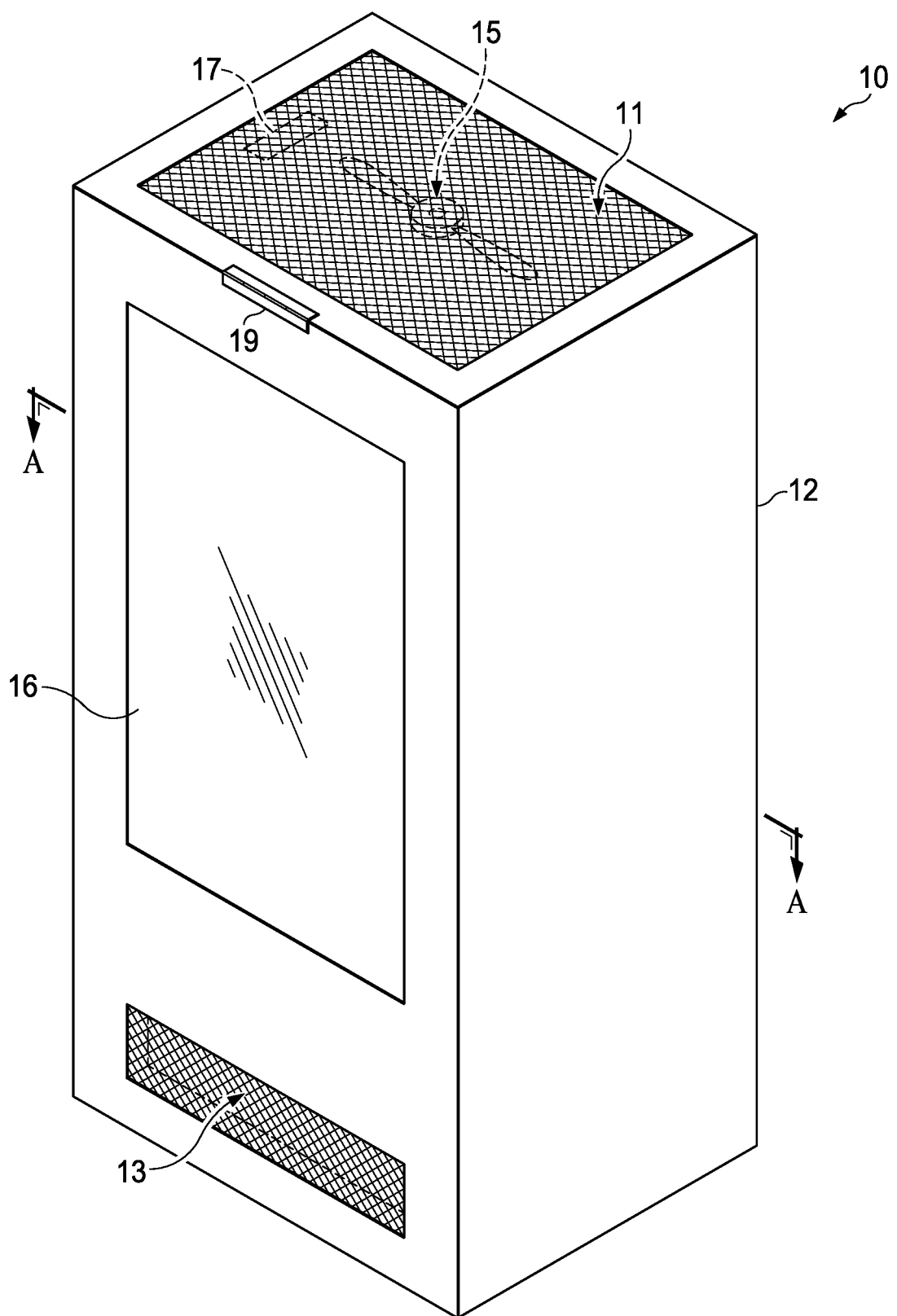
FIG. 1 is a perspective view of an exemplary display assembly also indicating section line A-A.

FIG. 1 is a perspective view of an exemplary display assembly 10. The display assembly 10 may comprise a housing 12 for one or more electronic displays 18 and 20. A first and second electronic display 18 and 20, in exemplary embodiments, are placed in a back to back arrangement and located on either side of the housing 12. In other exemplary embodiments, the electronics displays 18 and 20 may be placed above and below or next to one another. Any number of electronic display 18 and 20 provided in any size, shape, arrangement, orientation, and the like may be utilized. The electronic displays 18 and 20 may be liquid crystal, organic light emitting diode, plasma, rear projection, cathode ray tube type displays, some combination thereof, or the like. One or more of electronic displays 18 and 20 may comprise touch screen components or otherwise be capable of receiving touch input. The electronic displays 18 and 20 may be directly backlit or edge lit. The electronic displays 18 and 20 may comprise a cavity for each respective backlight.

Said electronic displays 18 and 20 may each be placed behind a respective transparent cover 14 and 16. The transparent cover 14 and 16 may be comprised of glass, a polymer, acrylic, some combination thereof, or the like. In exemplary embodiments, each transparent cover 14 and 16 may be formed by two transparent sheets joined by an optically clear adhesive, though such is not required. The housing 12 and the transparent covers 14 and 16 may substantially encase the electronic displays 18 and 20 in some exemplary embodiments.

In exemplary embodiments, one or more sides of the display assembly 10 may comprise a cavity for a static poster instead of, or in addition to, an electronic display 18 and 20. In other exemplary embodiments, a cavity for a static poster may be included in addition to the electronic displays 18 and 20. Such cavities may be back lit or edge lit to illuminate the poster or other signage located therein. In still other exemplary embodiments, instead of an electronic display 18 and 20 or a cavity for a static poster, one or more sides of the display assembly 10 may comprise a blank cover. The blank cover may be comprised of a metallic, a polymer, glass, or the like. For example, without limitation, the blank cover may be comprised of black glass, though any material may be utilized.

The display assembly 10 may further comprise an intake opening 11 and an exhaust opening 13. The intake opening 11 may facilitate the ingestion of ambient air 30. The exhaust opening 13 may facilitate the exhaustion of ambient air 30. The intake opening 11 and/or the exhaust opening 13 may comprise a grid, screen, filter, some combination thereof, or other device to limit the or prevent certain debris and particulate from entering the display assembly 10. In exemplary embodiments, the intake opening 11 may be located at or near the top of the display assembly 11 and the exhaust opening 13 may be located at or near the bottom of the display assembly 10. However, any location of the intake opening 11 and the exhaust opening 13 may be utilized. For example, without limitation, the intake opening 11 may be located on or near the upper portion of the display assembly 10, and the exhaust opening may be located on or near the lower portion of the display assembly 10. In still other exemplary embodiments, the intake opening 11 or the exhaust opening 13 may be located near a mid-point of the display assembly 10 or on the left or right side of the display assembly 10.

Figure 2:
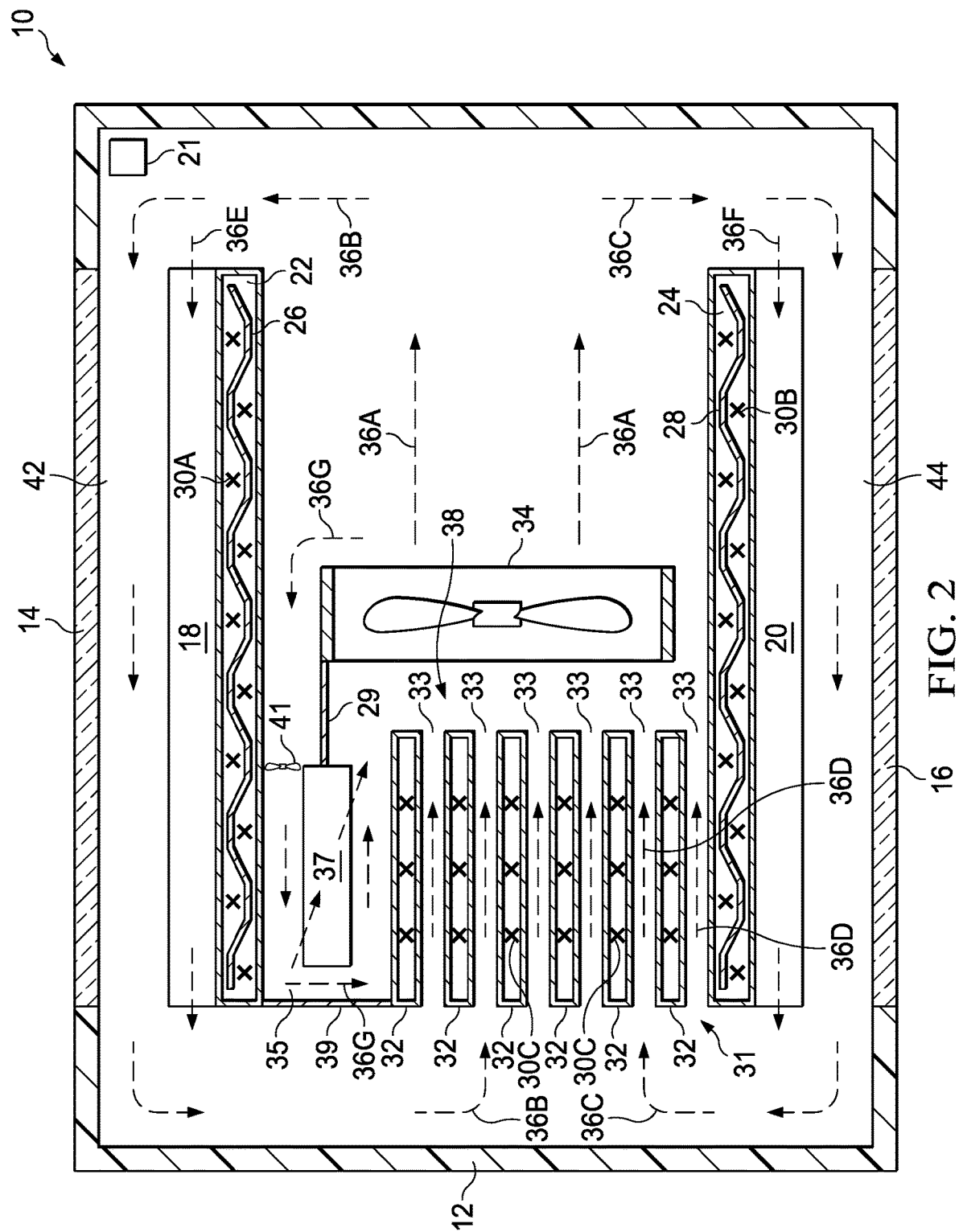
FIG. 2 is a top cross-sectional view along section line A-A of FIG. 1.

FIG. 2 is a top cross-sectional view of the display assembly 10 of FIG. 1 taken along section line A-A. An open loop channel 22 and 24 may be placed behind each respective electronic display 18 and 20, though other locations may be utilized. Each open loop channel 22 and 24 may be configured to receive a respective portion, or a separate flow, of the ingested ambient air 30A and 30B, which may travel through the respective open loop channel 22 or 24 before exiting the display assembly 10. Each open loop channel 22 and 24 may comprise corrugation 26 and 28. The corrugation 26 and 28 may be provided in any number of layers and in any shape(s). In exemplary embodiments, the open loop channels 22 and 24 may extend along and directly behind the backlight of each respective electronic display 18 and 20, though such is not required. The open loop channels 24 and 24 may comprise entirely separate pathways through the display assembly 10 or may be combined at one or more locations.

One or more open loop fans 15 may be placed on or near the intake opening 11 or the open loop channels 22 and 24 in order to force the ambient air 30A and 30B through the open loop channels 22 and 24. Various temperature, pressure, fan speed, air speed, and other sensors 17 may be placed within or near the open loop channels 22 and 24. Data from said sensors 17 may be received at one or more processors in electronic communication with the open loop fans 15. Operation of the open loop fans 15 may be adjusted to keep the display assembly 10, and various components and equipment thereof, from overheating and/or performing at various levels.

One or more heat exchangers 31 may be located between the first and second electronic displays 18 and 20. In exemplary embodiments, the heat exchanger(s) 31 are located between the first and second open loop channels 22 and 24. The heat exchanger(s) 31 may accept a portion, or flows, of the ingested ambient air 30C. The heat exchanger(s) 31 may comprise one or more layers 32 for ambient air 30C. The heat exchanger(s) 31 may comprise one or more layers 33 for circulating gas 36D. In exemplary embodiments, the layers 32 for the ambient air 30C are alternated with layers 33 for the circulating gas 36D, though such is not required. The heat exchanger(s) 31 may be cross flow, counter flow, parallel flow, or other types of heat exchangers.

A fan unit 34 may be placed adjacent to the heat exchanger 31 in order to force the circulating gas 36D to pass through the layers 33 of the heat exchanger 31. The fan unit 34 may be configured to force the circulating gas 36 through some or all of a closed loop pathway within the display assembly 10 when operated. The fan unit 34 may be positioned and/or otherwise configured to create an area of relatively low pressure 38 at a first side of the fan unit 34. The first side may be the side of the fan unit 34 facing the heat exchanger 31. The fan unit 34 may be positioned and/or otherwise configured to create an area of relatively high pressure 38 on a second side of the fan unit 34. The second side of the fan unit 34 may be opposite the first side. The fan unit 34 may comprise one or more fans which may be placed within one or more housings. Where more than one heat exchanger 31 is provided, more than one fan unit 34 may be utilized.

Some or all of the circulating gas 36D may pass through the fan unit 34 and exit as the circulating gas flow 36A. The circulating gas flow 36A may subsequently be divided into circulating gas flows 36B and 36C which may travel through a first and second front channels 42 and 44, respectively. The first front channel 42 may be located in the space between the first transparent cover 14 and the first electronic display 18. The second front channel 44 may be located in the space between the second transparent cover 16 and the second electronic display 20. These circulating gas flows 36B and 36C may be relatively cool after passing through the heat exchanger 31. These circulating gas flows 36B and 36C may pick up heat generated by solar loading as they pass through the front channels 42 and 44. These now relatively warm circulating gas flows 36B and 36C may be returned to the heat exchanger 31 to be cooled by the ambient gas passing through the heat exchanger 31. Various temperature, pressure, fan speed, air speed, and other sensors 21 may be placed along this closed loop pathway and data from said sensors 21 may be received at a processor in electronic communication with the fan unit 34 and operation of the fan unit 34 may be adjusted to keep the display assembly 10, and various components and equipment thereof, from overheating and/or operating at desired levels.

Each of the electronic displays 18 and 20 may include a backlight cavity for the backlight. The backlight cavity may be located behind the display element itself (e.g., liquid crystal layer). A portion of the circulating gas 36E and 36F may, in exemplary embodiments, be bled into these backlight cavities. This portion of the circulating gas 36E and 36F may travel through the respective backlight cavity and rejoin the circulating gas flows 36B and 36C. These backlight cavity flows 36E and 36F may exert pressure against the display elements of the electronic displays 18 and 20 to prevent the electronic displays 18 and 20 from bowing.

One or more barriers 39 may extend from one or more of the open loop channels 22 and 24 to the heat exchanger 31. In this way, a portion of what would otherwise be area for the flow of the circulating gas 36B and 36C may be partitioned. In exemplary embodiments, the barrier(s) 39 extends from the rear surface of the first open loop channel 22 such that each barrier 39 is substantially aligned with a side surface of the open loop channel 22, though such is not required. In this way, the circulating gas 36B or 36C exiting the respective front channel 42 or 44 may be forced to travel a distance before entering the heat exchanger 31. Regardless, the barrier(s) 39 may partition storage area(s) 35. The barrier(s) 39 may comprise any number of components, members, walls, partitions, or the like arranged in any shape to define any size or shape storage area 35.

One or more equipment storage devices 37 may be positioned within each storage area 35. In exemplary embodiments, the equipment storage devices 37 may be located in the storage area 35. The storage area 35 may be defined between the barrier 39, the open loop channel 22 or 24, and the heat exchanger 31 in exemplary embodiments, without limitation. The display assembly 10 may comprise one or more storage areas 35, and one or more corresponding barriers 39, at multiple locations within the display assembly 10. For example, without limitation, a second storage area 35 may be located behind the second open loop channel 24.

The equipment storage device 37 may each comprise one or more server racks, plates, racks, cabinets, compartments, trays, shelves, some combination thereof, or the like. In exemplary embodiments, the equipment storage device 37 comprises a 1U server racks, though such is not required. A number of such equipment storage devices 37 may be provided in a given storage area 35. For example, without limitation, multiple equipment storage devices 37 may be provided vertically through storage area 35 as it extends through the display assembly 10. Different equipment storage devices 37 may be provided in different storage areas 35. Each of the equipment storage devices 37 may be configured to receive one or more pieces of equipment for operating the electronic displays 18 and 20 and the display assembly 10, as well as various customer equipment such as, but not limited to, sensors, network connectivity devices, communications equipment, video players, storage devices, processors, sensors, computers, audio equipment, microphones, speakers, visual equipment, cameras, some combination thereof, and the like.

The portions of the circulating gas 36A exiting the fan unit 34 may be at a relatively high pressure as compared to the portions of the circulating gas 36B and 36C entering the heat exchanger 32. A relatively high-pressure area 40 may be defined beyond the fan unit 34. Circulating gas 36A entering this high-pressure area 40 may be attracted to a relatively low-pressure area 38 defined by the storage area 35. A portion of the relatively high-pressure circulating gas 36B and 36C may flow towards the storage area 35 and form a loopback flow 36G. The loopback flow 36G may enter the storage area 35 and circulate around the equipment storage devices 37. In exemplary embodiments, the loopback flow 36G may additionally or alternatively circulate through some or all of the equipment storage devices 37. One or more fans 41 may be located within or near the storage areas 35 in order to force movement of the loopback flow 36G around or through the equipment storage devices 37 and around or through the equipment located thereon. The fans 41 may be controlled, at least in part, by data received from the sensors 21. In exemplary embodiments, one or more additional barriers 29 may extend between the fan unit 34 and the equipment storage devices 37. The additional barrier(s) 29 may separate the loopback flow 36G initially looping back from the high-pressure area 40 and entering the storage area 35 from the loopback flow 36G exiting the storage area 35 to return to the low-pressure area 38 and the fan unit 34.

The use of the loopback flow 36G, for example without limitation, may permit only the necessary amount of circulating gas 36G to enter and cool the equipment in the equipment storage devices 37. A significant portion of the circulating gas 36 may remain dedicated to removing heat generated by solar loading at the front channels 42 and 44. Additionally, the use of the loopback flow 36G may permit cooled circulating gas 36G which has already passed through the heat exchanger 31 to be used to cool the equipment in the equipment storage devices 37. Otherwise, the air entering from circulating gas flows 36B and 36C would be relatively warm after just passing through the front channels 42 and 44, respectively. This may permit flexibility in placement, size, shape, and the like of the storage area 35 and the equipment storage devices 37. The size and location of the barriers 39 and 29 as well as the storage area 35 and the equipment storage devices 37 may be selected to control the amount and speed of the loopback flow 36G to match thermal management needs.

The first and second open loop channels 22 and 24 as well as the layers 32 of the heat exchanger 31 may form an open loop pathway for the ambient air 30. The layers 33 of the heat exchanger 31, the low-pressure area 38, the storage area 35, the high-pressure area 40, the first and second front channels 42 and 44, as well as the backlight cavities of the first and second electronic display 18 and 20 may form one or more closed loop pathways for the circulating gas 36. The closed loop pathways may be substantially sealed such that the circulating gas 36 located within may remain substantially free of contaminants or other particulate which may otherwise be present in the ambient air 30. Sensitive electronic equipment may be located along the closed loop pathway(s) and thereby kept substantially free of contaminants or other particulate that may be present in the ambient air 30. Additionally, in this way the sensitive electronic equipment may only be exposed to the circulating gas 36, which may have controlled airspeed, pressure, humidity, and the like. The circulating gas 36 may be cooled by thermal interaction with the ambient air 30 at the heat exchanger 31. Additional cooling may be provided by the various open loop pathways, such as but not limited to, the open loop channels 22 and 24. The open loop channels 22 and 24 may be placed immediately behind the backlights for the electronic displays 18 and 20, in exemplary embodiments, so as to remove heat generated from the backlights.

In exemplary embodiments, the first transparent cover 14, the first electronic display 18, and the first open loop channel 22 may be part of a first side assembly. Similarly, the second transparent cover 16, the second electronic display 20, and the second open loop channel 24 may be part of a second side assembly. Any number of side assemblies for any number of transparent covers 14 and 16, electronic display 18 and 20, and open loop channels 22 and 24 may be utilized. The side assemblies may be mounted to the housing 12 in a hinged fashion by way of one or more hinges 19 such that the side assemblies may be rotated outwards to access the equipment storage devices 37 and the equipment installed thereon.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing device. The electronic devices may be personal computers, smartphone, tablets, databases, servers, or the like. The electronic connections and transmissions described herein may be accomplished by wired or wireless means.

What is claimed is:

1. A system for thermally managing a display assembly comprising:
   an electronic display;
   a housing;
   a closed loop pathway for circulating gas comprising a channel located adjacent to the electronic display;
   a fan unit positioned within the channel;
   a storage area within or adjacent to the channel;
   a barrier partitioning the storage area from the channel;
   an equipment storage device placed within the storage area and configured to accept electronic equipment; and
   a loopback channel configured to accept a flow of the circulating gas, wherein said loopback channel forms a pathway about the equipment storage device;
   wherein said fan unit is configured to generate an area of relatively high pressure circulating gas compared to the flow of the circulating gas in said storage area such that the flow of the circulating gas travels through the loopback channel to cool the electronic equipment stored at the equipment storage device when said fan unit is operated.

2. The system of claim 1 further comprising:
   an additional barrier extending between said fan unit and said equipment storage device to separate the flow of circulating gas entering the storage area from the flow of circulating gas exiting the storage area.

3. The system of claim 1 wherein:
   said equipment storage device comprises a server rack.

4. The system of claim 3 wherein:
   said electronic equipment is selected from a group consisting of: network connectivity devices, communications equipment, video players, storage devices, processors, sensors, computers, audio equipment, microphones, speakers, visual equipment, and cameras.

5. The system of claim 1 further comprising:
   a heat exchanger located within said channel.

6. The system of claim 5 wherein:
   said heat exchanger comprises a number of layers;
   a first portion of said number of layers is configured to receive the circulating gas; and
   a second portion of said number of layers is configured to receive the ambient air.

7. The system of claim 6 wherein:
   each of said first portion of said number of layers alternates with each of said second portion of said number of layers.

8. The system of claim 5 further comprising:
   an open loop pathway for ambient air.

9. The system of claim 8 further comprising:
   a transparent cover for the electronic display;
   a front channel forming part of the closed loop pathway, wherein said front channel is located between the transparent cover and the electronic display, and wherein said front channel is in fluid communication with said channel.

10. The system of claim 9 wherein:
    said open loop pathway comprises an open loop channel located between the channel and the electronic display.

11. The system of claim 1 further comprising:
    a loopback fan positioned within or adjacent to the storage area and configured to facilitate the flow of a portion of the circulating gas through the loopback channel when operated.

12. The system of claim 1 further comprising:
    a sensor in electronic communication with said fan unit, wherein said sensor is positioned and configured to detect at least one of temperature and pressure of the circulating gas, wherein a speed of the fan unit is adjusted based upon readings received from said sensor.

13. A method for thermally managing a display assembly comprising the steps of:
    providing a closed loop pathway through a housing for an electronic display, said closed loop pathway comprising a heat exchanger and a fan unit, and wherein said closed loop pathway passes around the electronic display;
    providing one or more barriers to define a storage area comprising an equipment storage device, wherein said storage area is located within said closed loop pathway and behind said electronic display, and wherein said storage area is positioned adjacent to said heat exchanger and said fan unit; and
    operating the fan unit to force circulating gas through the closed loop pathway to create a relatively high-pressure flow of circulating gas on a first side of said fan unit compared to a relatively low-pressure flow of circulating gas within said storage area such that a portion of said circulating gas is looped back through said storage area.

14. The method of claim 13 further comprising the steps of:
    passing ambient air through an open loop pathway, wherein said open loop pathway comprises said heat exchanger and travels through said housing.

15. The method of claim 14 wherein:
    said open loop pathway passes along a rear surface of a backlight for the electronic display; and said storage area is positioned between said open loop pathway, said heat exchanger, and said fan unit.

16. The method of claim 15 wherein:

said storage area is further defined by one or more additional barriers extending between said fan unit and said equipment storage device to separate a portion of the circulating gas entering the storage area from a portion of the circulating gas exiting the storage area.

17. The method of claim 16 wherein:

said closed loop pathway comprises a channel located between a transparent cover and the electronic display.

18. A system for thermally managing a display assembly comprising:
- a housing;
- a first electronic display positioned at said housing and facing a first direction;
- a first transparent cover positioned at said housing in front of said first electronic display;
- a second electronic display positioned at said housing and facing a second direction opposing said first direction;
- a second transparent cover positioned at said housing in front of said second electronic display;
- a first open loop pathway for ambient air positioned along a rear surface of the first electronic display;
- a second open loop pathway for ambient air positioned along a rear surface of the second electronic display;
- a closed loop pathway for circulating gas comprising:
  - a first front channel positioned between the first transparent cover and said first electronic display;
  - a second front channel positioned between the second transparent cover and said second electronic display;
  - a common channel located between the rear surface of the first electronic display and the rear surface of the second electronic display;
  - a heat exchanger located within said common channel;
  - a fan unit positioned adjacent to said heat exchanger;
  - a barrier located within said common channel;
  - a storage area defined by the barrier, said first open loop pathway, and said fan unit;
  - an equipment storage device located within said storage area; and
  - a loopback cooling channel configured to accept a portion of the circulating gas exiting said fan unit and circulate said portion of the circulating gas through said storage area.

19. The system of claim 18 further comprising:

an additional barrier extending between said equipment storage device and said fan unit to separate the portion of the circulating gas entering the storage area from the portion of the circulating gas exiting the storage area.

20. The system of claim 18 wherein:

said equipment storage device comprises a server rack;

said first and second electronic displays each comprise a liquid crystal layer;

said first and second electronic displays each comprise a direct backlight; and said fan unit comprises a number of fans.

* * * * *